(12) United States Patent
Cariker

(10) Patent No.: US 8,929,087 B1
(45) Date of Patent: Jan. 6, 2015

(54) PRESS-FIT EMI SHIELD AND ELECTRONIC DEVICES INCLUDING SAME

(75) Inventor: Bruce A. Cariker, Diamond Bar, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 178 days.

(21) Appl. No.: 13/479,208

(22) Filed: May 23, 2012

(51) Int. Cl.
*H05K 7/02* (2006.01)
*H05K 9/00* (2006.01)

(52) U.S. Cl.
CPC ........................................ *H05K 9/00* (2013.01)
USPC ........... 361/752; 361/760; 361/818; 361/816; 174/377; 174/382

(58) Field of Classification Search
USPC .......................................... 361/752, 816, 818
See application file for complete search history.

(56) References Cited

U.S. PATENT DOCUMENTS

| 4,216,576 | A | * | 8/1980 | Ammon et al. ................. | 29/845 |
| 6,274,808 | B1 | * | 8/2001 | Cercioglu et al. ............. | 174/371 |
| 6,866,544 | B1 | | 3/2005 | Casey et al. | |
| 7,271,978 | B1 | | 9/2007 | Santini et al. | |
| 7,280,368 | B2 | * | 10/2007 | Iwamiya et al. ............... | 361/760 |
| 7,443,693 | B2 | | 10/2008 | Arnold et al. | |
| 2003/0107881 | A1 | * | 6/2003 | Muramatsu et al. .......... | 361/818 |
| 2005/0048838 | A1 | | 3/2005 | Korsunsky et al. | |
| 2007/0081311 | A1 | * | 4/2007 | Iwamiya et al. ............... | 361/760 |

FOREIGN PATENT DOCUMENTS

JP       10326993 A  * 12/1998
JP    02003179378 A  *  6/2003

* cited by examiner

*Primary Examiner* — Jayprakash N Gandhi
*Assistant Examiner* — Mandeep Buttar

(57) ABSTRACT

An electromagnetic shield for a storage device comprising a printed circuit board (PCBA) defining a plated through hole defining a generally cylindrical plated surface. The electromagnetic shield may comprise a top surface and sides oriented generally perpendicular to the top surface. One or more of the sides comprise a press-fit connector configured for removable insertion in the plated through hole. The press-fit connector may comprise at least one resilient member defining a longitudinal axis and configured to resiliently bow out in a direction generally perpendicular to the longitudinal axis during insertion and press against the plated surface of the through hole to displace plating material formed thereon to form a gas-tight seal between the at least one resilient member and the plated surface.

16 Claims, 4 Drawing Sheets

F

PRESS-FIT EMI SHIELD AND ELECTRONIC DEVICES INCLUDING SAME

BACKGROUND

Data storage devices, whether based on rotating media, on solid state memory or hybrid technologies, emit electromagnetic radiation, often from their printed circuit board assembly (PCBA). PCBAs mechanically support and electrically connect electronic components using conductive pathways mounted on a resin base. Electromagnetic Interference (EMI) shields are often used to minimize the emitted radiation. Current single-piece EMI shields must be soldered onto the PCBA. If such single-piece EMI shields are installed before the automatic soldering process, they can obstruct and shield some of the electronic components from the applied heat, causing them to not solder or become improperly soldered. To avoid this issue, single piece EMI shields are hand-soldered to the PCBA after the automatic soldering process. If, however, rework is required after the installation of the EMI shield onto the PCBA, the EMI shield must be manually de-soldered from the PCBA and removed before the technician can access the underlying components for diagnostics and service.

A two-piece EMI shield system has also been used, where a fence is soldered into place around the components of the PCBA. After the fence is installed and automatic soldering is completed, a lid is placed over the components and affixed to the fence. The fence, however, must often be manually de-soldered for removal if it interferes with rework of later-discovered defective components.

Press-fit pins are used to manufacture backplane PCBAs, where banks of pins are inserted without the need for soldering. These pins permanently deform as they are pushed into through holes defined in the PCBA and bear against the through holes, thereby creating an electrical connection to the conductive surfaces inside the holes of the PCBA. However, if re-work becomes necessary and the pins must be removed from the through holes into which they are inserted, the permanent deformation of the pins upon initial insertion prevents them from thereafter being re-inserted and re-forming the needed electrical connection.

DETAILED DESCRIPTION

Figure 1:
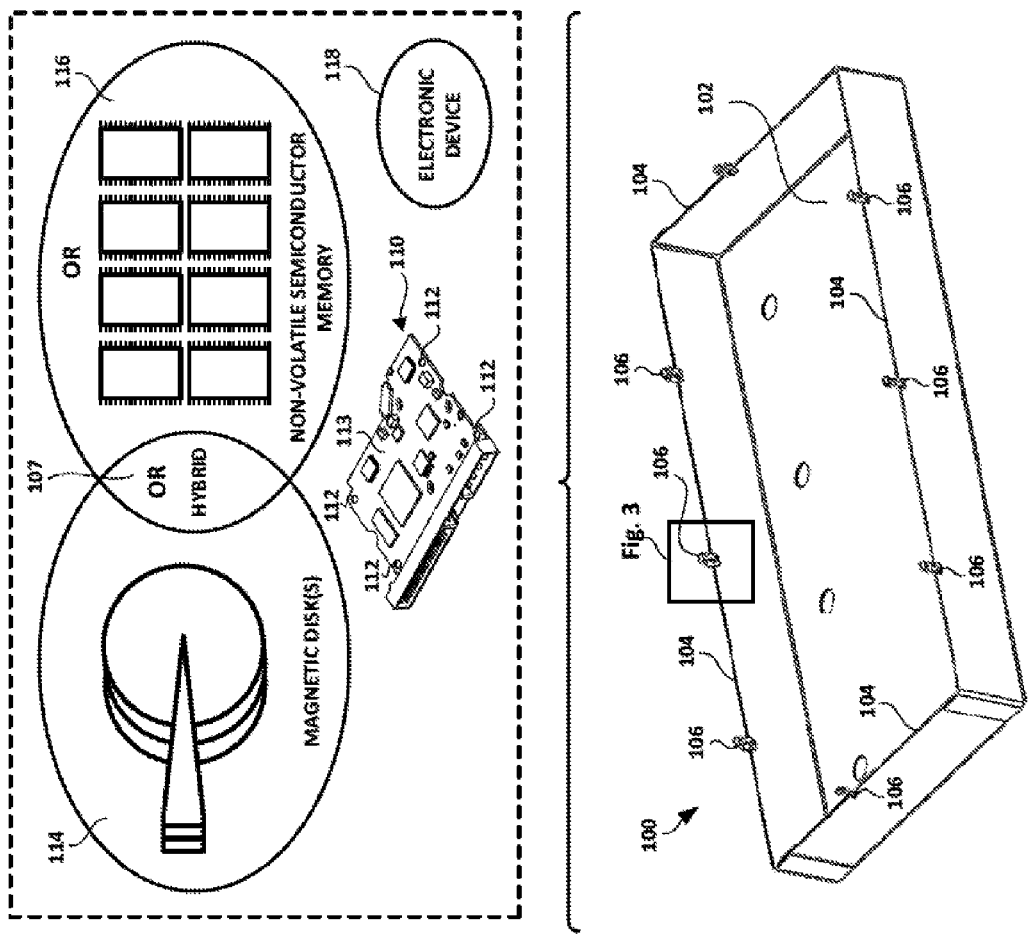
FIG. 1 shows an EMI shield configured for coupling to a PCBA of a data storage device and comprising press-fit pins, according to one embodiment.

FIG. 1 shows an EMI shield configured for coupling to a PCBA of a data storage device and comprising press-fit pins, according to one embodiment. The electromagnetic interference shield 100, according to one embodiment, may be coupled to any electronic device comprising a PCBA, such as the exemplary PCBA shown at 110 in FIG. 1. According to one embodiment, the electromagnetic interference shield 100 may be configured to be coupled to a data storage device. According to one embodiment, the electromagnetic interference shield 100 may be coupled to a magnetic disk drive 114. Further, according to one embodiment, the electromagnetic interference shield 100 may be coupled to a data storage device comprising non-volatile semiconductor memory, such as a Solid State Drive (SSD) as shown at 116. Further still, according to one embodiment, the electromagnetic interference shield 100 may be coupled to a hybrid drive comprising both magnetic disk(s) and non-volatile semiconductor memory, as shown at 107. More generally, however, the electromagnetic interference shield 100 may be coupled to any electronic device 118 comprising a PCBA, such as shown at 110. Accordingly, one embodiment is an assembly comprising a magnetic disk drive 114 and an EMI shield 100. Also, one embodiment is an assembly comprising a data storage device comprising non-volatile semiconductor memory 116 and an EMI shield 100. Further, one embodiment is an assembly comprising a hybrid drive 107 comprising both magnetic disk(s) and non-volatile semiconductor memory and an EMI shield 100. Further still, one embodiment is an assembly comprising an electromagnetic interference shield 100 and an electronic device 118. The PCBA 110 may comprise a controller for a data storage device and/or may comprise other electronic components. For example, the PCBA 110 may comprise an interface board. The interface board may be configured, for example, to connect between a SATA data storage device and a USB port.

As shown in FIG. 1, the EMI shield 100 may comprise a top surface 102 and sides 104 oriented generally perpendicular to the top surface 102. The EMI shield 100 may be stamped from, for example, a single sheet of sheet metal and folded to create the sides 104. One or more of the sides 104 may support and define one or more press-fit pins 106. The press-fit pins 106 may also be integrally formed of the single sheet of sheet metal. Alternatively, the press-fit pins 106 may be formed separately from the top surface 102 and the sides 104 and attached to the sides 106. The press-fit pins 106 may be configured for removable insertion into corresponding ones of through-holes defined in the PCBA 110. Indeed, the PCBA 110 may define a first major surface 113 (visible in FIG. 1) and a second major surface that faces the first major surface 113 (hidden from view in FIG. 1) and one or more conducting plated though holes 112 extending from the first major surface through to the second major surface and defining a generally cylindrical through hole plated surface (best, shown at 402 in FIG. 4) therebetween. The EMI shield 100 may be formed of an electrically conductive material and the plating material formed or deposited on the cylindrical surface defining the through holes 112 may also be electrically conductive. Therefore, when the EMI shield 100 is coupled to the PCBA 110 when the press-fit pins 106 insert into corresponding plated through holes 112 of the PCBA 110, a common reference potential (e.g., ground) may be created at the through holes 112 and at all traces on the PCBA 110 connecting thereto.

Figure 2:
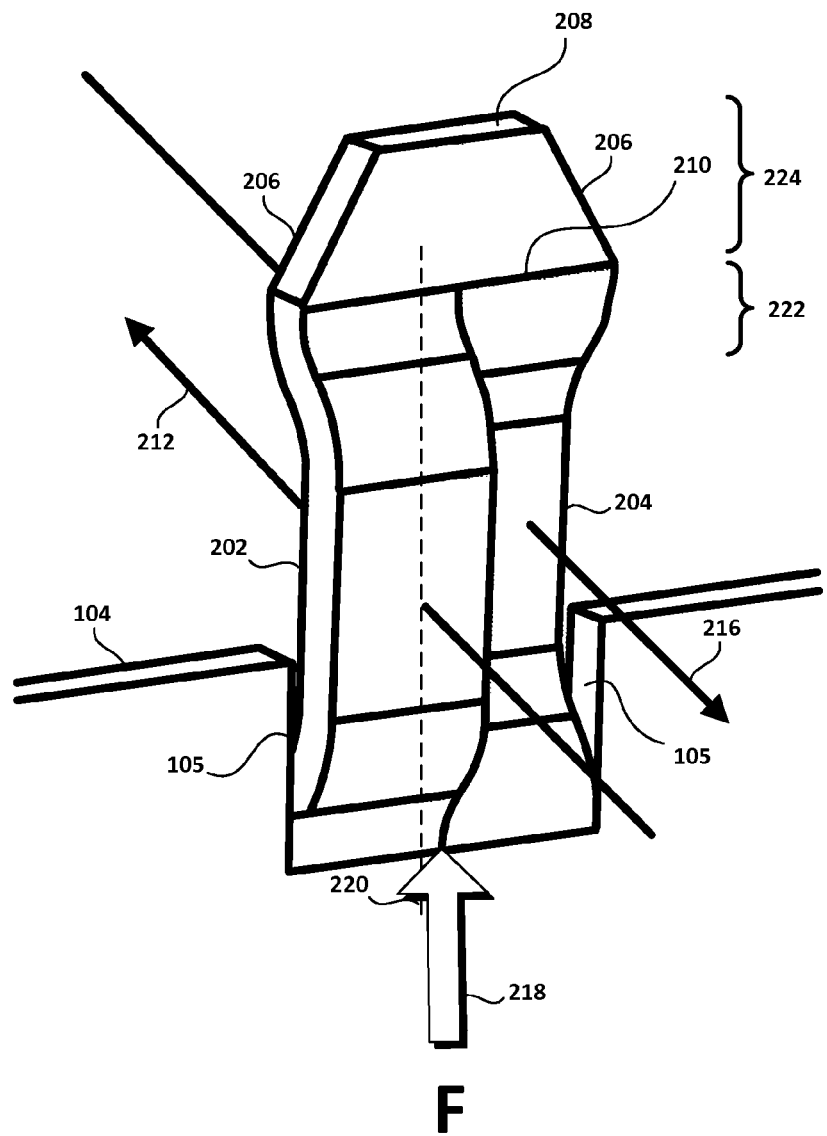
FIG. 2 is a detail view of one of the press-fit pins shown of FIG. 1, according to one embodiment.

FIG. 2 is a detail view of one of the press-fit pins 106 shown of FIG. 1, according to one embodiment. FIG. 2 shows a portion of a side 104 of the EMI shield 100 from which a press-fit pin 106 extends. According to one embodiment, the press-fit pins 106 extend from a cut-out 105 defined in the sides 104 of the EMI shield 100. According to one embodiment, the press-fit pins 106 comprises at least one resilient member, such as shown at 202, 204 in FIG. 2. The resilient member 202, 204 may define a longitudinal axis 220 and may be configured to resiliently bow out in a direction that is generally perpendicular to the longitudinal axis 220 during insertion into a plated through hole 112. That is, during insertion of the press-fit pin 106 into a plated through hole 112 of the PCBA 110, a force F, directed in a direction 218 that is generally parallel to the longitudinal axis 220 is exerted on the press-fit pin 106 by the sides of the plated through hole 112. This force F causes the resilient member 202, 204 to deflect inwardly in a direction 212, 216 that is generally perpendicular to the longitudinal axis 220. As shown in FIG. 2, the resilient member 202, 204 may be bent so as to be biased to bow out in one direction. According to one embodiment, the press-fit pin 106 may be configured to comprise both a first resilient member 202 and a second resilient member 204, disposed adjacent the first resilient member 202. The first resilient member 202 may be bent into a first shape that tends to cause the resilient member 202 to bow out, in an unstressed state, in a direction opposite that shown by the arrow referenced at 212. Similarly, the second resilient member 204 may be bent into a second shape that tends to cause the resilient member 204 to bow out, in an unstressed state, in the direction opposite that shown by the arrow referenced at 216 that is generally opposite the direction referenced at 212. Both directions 212, 216 may be characterized as being generally perpendicular to the longitudinal axes of the resilient members 202, 204 and generally parallel to the top surface 102 of the EMI shield 100. In the unstressed configuration, the resilient members 202, 204 may bow out so as to present a wider profile than that of the plated through hole 112.

As shown in FIG. 2 the press-fit pin 106 may define a tapered free end. According to one embodiment, the tapered free end may join the first and second resilient members 202, 204. The tapered free end may define a pair of angled surfaces 206 joining a proximal (i.e., closer to side 104) portion 222 having a width 210 that may (but need not) be somewhat larger than a diameter of the plated through hole 112 and a distal portion 224 (i.e., further away from the side 104) having a free end 208 having a width that is somewhat smaller than the diameter of the plated through hole 112 of the PCBA 110. The thus formed tapered end is configured to guide and ease insertion of the press-fit pin 106 into the through hole 112, as further detailed hereunder.

Figure 3:
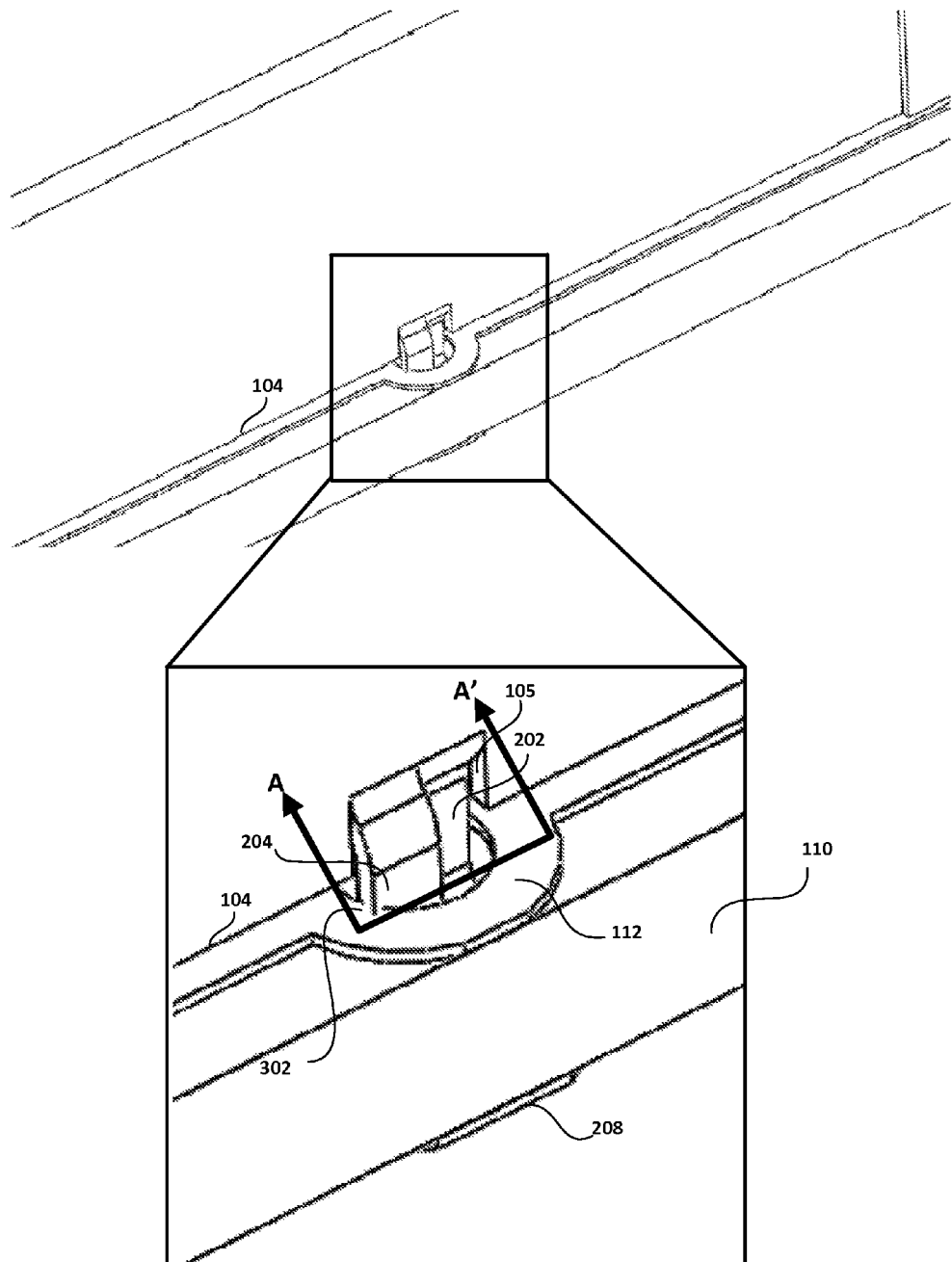
FIG. 3 shows a portion of an EMI shield coupled to a PCBA, according to one embodiment.

FIG. 3 shows a portion of an EMI shield 100 coupled to a PCBA 110, according to one embodiment. FIG. 3 shows a portion of a side 104, the cutout 105 and a press-fit pin 106 extending through a plated through hole 112 of a PCBA 110 according to one embodiment. The free end 208 of the distal portion 224 of the press-fit pin 106 is shown emerging through the plated through hole 112 to the other side of the PCBA 110. According to one embodiment, as the press-fit pin 106 is inserted into the plated through hole 112, the free end 208, having a distal portion 224 of a somewhat smaller width than the diameter of the plated through hole 112, readily engages into the plated through hole. The angled surfaces 206 then guide the tapered free end of the press-fit pin 106 toward a center of the plated through hole 112. As the press-fit pin 106 is inserted into the plated through hole 112 through application of the force 218 shown in FIG. 2, the angled surfaces 206 may contact and press against the plating material of the plated through hole 112. In so doing, the resilient members 202, 204 may be deflected in the directions 212, 216 to conform to the size of the plated through hole 112 and may displace some of the plating material and/or oxide formed on the interior generally cylindrical surface (402, see FIG. 4) of the plated through hole 112, thereby forming a gas-tight seal between at least the corners 302 of the resilient members 202, 204 and the plated surface of the plated through hole 112.

Figure 4:
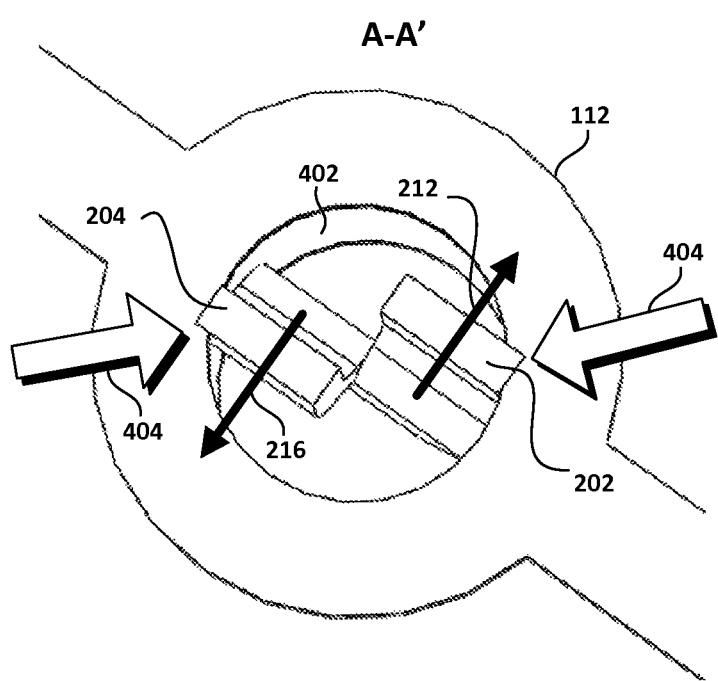
FIG. 4 is a cross-sectional view of a press-fit pin of an EMI shield, inserted into a plated through hole of a PCBA, according to one embodiment.

FIG. 4 is a cross-sectional view of a press-fit pin 106 of an EMI shield 100, inserted into a plated through hole 112 of a PCBA 110, according to one embodiment. The cross-sectional view of FIG. 4 is taken along cross-sectional line A-A' shown in FIG. 3, and shows the manner in which the resilient members 202, 204 bow out to make contact with, press against and displace some the plating material from the interior plated surface 402 of the plated through hole 112 of a PCBA 110. As shown, as the press-fit pin 106 is inserted into the plated through hole 112, the resilient members 202, 204, initially presenting a wider profile than that of the plated through hole 112, may be deflected inwardly to conform to the size of the plated through hole 112 but still exert force against the sides thereof in the directions shown at 212 and 216, respectively. This bowing out or deflection causes the sides and corners of the resilient members 202, 204 to press against the interior plated surface 402 of the plated through hole 112, and to displace some of the plating material and/or oxide layer formed thereon. Arrows 404 show locations where some of the plating material is displaced by the corners and sides of the resilient members 202, 204, thereby forming a gas-tight seal between the press-fit pins 106 and the plated through hole 112. This gas-tight seal prevents corrosion at the interface of the press-fit pin 106 and the plated through hole 112 which, in turn, ensures a good electrical contact between the press-fit pin 106 (and therefore the EMI shield 100) and the plated through hole 112 (and therefore the ground layer of the PCBA 110), which electrical contact, by virtue of this gas-tight seal, should not significantly degrade over the lifetime of the PCBA 110.

Advantageously, the resiliency of the first and second resilient members 202, 204 enables the press-fit pin 106 to be removably inserted into the plated through hole 112. That is, the press-fit pin 106 may be readily removed from the plated through hole 112, by exerting a force on the press-fit pin 106 in a direction that is opposite the direction shown at 218 in FIG. 2 by pulling the press-fit pin 116 out of the plated through hole 112. This force, according to one embodiment, causes the first and second resilient members to pull back from the interior surface 402 of the plated through hole 112 and enable the press-fit pin 106 to be retracted from the plated through hole 112. By virtue of the resiliency of the resilient members 202, 204, the press-fit pins 106 thereafter may resume a same or similar configuration as that shown in FIG. 2, in which the press-fit pin 106 is once again ready for re-insertion into the plated through hole 112 to again re-form a gas-tight seal therewith.

According to one embodiment, the EMI shield 100, equipped with its press-fit pins 106, eliminates the need for a secondary process to hand-solder EMI shields. According to one embodiment, the EMI shield 100, equipped with its press-fit pins 106 also eliminates the need to de-solder EMI shields in order to perform rework on the PCBA 110. Indeed, according to one embodiment, the EMI shield 100 may be removed to access PCBA components and replaced without the need for de-soldering and re-soldering the EMI shield 100. According to one embodiment, moreover, the one-piece EMI shield 100 reduces the time needed for assembly of a multi-part EMI shield by at least 50%.

While certain embodiments of the inventions have been described, these embodiments have been presented by way of example only, and are not intended to limit the scope of the inventions. Indeed, the novel devices and systems described herein may be embodied in a variety of other forms. Furthermore, various omissions, substitutions and changes in the form of the structures and systems described herein may be made without departing from the spirit of the inventions. The accompanying claims and their equivalents are intended to cover such forms or modifications as would fall within the scope and spirit of the inventions. For example, those skilled in the art will appreciate that in various embodiments, the actual structures (such as, for example, the shape of the resilient member or members 202, 204) may differ from those shown in the figures. Depending on the embodiment, certain of the structures described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. An electromagnetic shield for a storage device comprising a printed circuit board (PCBA) defining a plated through-hole defining a generally cylindrical plated surface, the electromagnetic shield comprising:
 a top surface; and
 sides oriented generally perpendicular to the top surface, at least one of the sides comprising a press-fit connector configured for removable insertion in the plated through-hole, the press-fit connector comprising:
  a first resilient member and a second resilient member disposed adjacent the first resilient member; and
  a tapered free end joining the first and second resilient members, the first and second resilient members defining a longitudinal axis and each configured to resiliently bow out in a direction generally perpendicular to and away from the longitudinal axis as the tapered free end presses against a plated surface of the through-hole during insertion and displaces plating material or oxide formed thereon to form a gas-tight seal between the first and second resilient members and the plated surface.

2. The electromagnetic shield of claim 1, wherein the tapered free end is further configured to guide insertion into the through-hole.

3. The electromagnetic shield of claim 1, wherein the tapered free end defines a distal portion having a width smaller than a diameter of the through-hole and a proximal portion having a width larger than the diameter of the through-hole.

4. The electromagnetic shield of claim 1, wherein the first resilient member is configured to bow out away from the longitudinal axis in a first direction and wherein the second resilient member is configured to bow out away from the longitudinal axis in a second direction generally opposite the first direction, during insertion of the press-fit connector into the through-hole.

5. The electromagnetic shield of claim 1, wherein the first and second resilient members comprise at least one corner that is configured to press against the plated surface of the through-hole and to displace the plating material or oxide during insertion of the press-fit connector into the plated through-hole.

6. The electromagnetic shield of claim 1, wherein the top surface, sides and the press-fit connector are integrally formed of a single sheet of homogenous material.

7. A data storage device, comprising:
 a printed circuit board assembly (PCBA), the PCBA comprising first and a second major surfaces and a conducting plated through-hole extending from the first major surface to the second major surface and defining a generally cylindrical through-hole plated surface therebetween, and
 an electromagnetic shield configured to couple to the PCBA, the electromagnetic Shield defining a top surface and sides oriented generally perpendicular to the top surface, at least one of the sides comprising a press-fit connector configured for removable insertion into the through-hole, the press-fit connector comprising a first resilient member and a second resilient member disposed adjacent the first resilient member, a tapered free end joining the first and second resilient member, the first and second resilient members defining a longitudinal axis and each configured to resiliently bow out in a direction generally perpendicular to and away from the longitudinal axis as the tapered free end presses against the plated surface during insertion and displaces plating material or oxide formed thereon to form a gas-tight seal between the first and second resilient members and the plated surface.

8. The data storage device of claim 7, wherein the tapered free end is further configured to guide insertion into the through-hole.

9. The data storage device of claim 7, wherein the tapered free end defines a distal portion having a width smaller than a diameter of the through-hole and a proximal portion having a width larger than the diameter of the through-hole.

10. The data storage device of claim 7, wherein the first resilient member is configured to bow out away from the longitudinal axis in a first direction and wherein the second resilient member is configured to bow out away from the longitudinal axis in a second direction generally opposite the first direction, during insertion of the press-fit connector into the through-hole.

11. The data storage device of claim 7, wherein the first and second resilient members comprise at least one corner that is configured to press against the plated surface of the through-hole and to displace the plating material or oxide during insertion of the press-fit connector into the through-hole.

12. The data storage device of claim 7, wherein the top surface, sides and the press-fit connector are integrally formed of a single sheet of homogenous material.

13. An electronic device, comprising:
 a printed circuit board assembly (PCBA), the PCBA comprising first and a second major surfaces and a conducting plated through-hole extending from the first major surface to the second major surface and defining a generally cylindrical through-hole plated surface therebetween, and
 an electromagnetic shield configured to couple to the PCBA, the electromagnetic shield defining a top surface and sides oriented generally perpendicular to the top surface, at least one of the sides comprising a press-fit connector configured for removable insertion into the through-hole, the press-fit connector comprising a first resilient member and a second resilient member disposed adjacent the first resilient member, a tapered free end joining the first and second resilient member, the first and second resilient members defining a longitudinal axis and each configured to resiliently how out in a direction generally perpendicular to and away from the longitudinal axis as the tapered free end presses against a plated surface of the through-hole during insertion and displaces plating material or oxide formed thereon to form a gas-tight seal between the first and second resilient members and the plated surface.

14. The electronic device of claim 13, wherein the tapered free end defines a distal portion having a width smaller than a diameter of the through-hole and a proximal portion having a width larger than the diameter of the through-hole.

15. The electronic device of claim 13, wherein the first and second resilient members define at least one corner that is configured to press against the plated surface of the through-hole and to displace the plating material or oxide dining insertion of the press-fit connector into the through-hole.

16. The electronic device of claim 13, wherein the top surface, sides and the press-fit connector are integrally formed of a single sheet of homogenous material.

* * * * *